US012725751B2

(12) United States Patent
Provo et al.

(10) Patent No.: US 12,725,751 B2
(45) Date of Patent: Sep. 1, 2026

(54) IMPLANTABLE MEDICAL DEVICE SELECTIVE ENCAPSULATION

(71) Applicant: Cardiac Pacemakers, Inc., St. Paul, MN (US)

(72) Inventors: Katherine Provo, Plymouth, MN (US); James Michael English, Cahir (IE); Shane McGrath, Thurles (IE); Joseph Thomas Delaney, Jr., Minneapolis, MN (US)

(73) Assignee: Cardiac Pacemakers, Inc.

( * ) Notice: Subject to any disclaimer, the term of this patent is extended or adjusted under 35 U.S.C. 154(b) by 482 days.

(21) Appl. No.: 18/498,767

(22) Filed: Oct. 31, 2023

(65) Prior Publication Data

US 2024/0290566 A1 Aug. 29, 2024

Related U.S. Application Data

(60) Provisional application No. 63/461,978, filed on Apr. 26, 2023, provisional application No. 63/447,750, filed on Feb. 23, 2023.

(51) Int. Cl.
*H01J 11/20* (2012.01)
*H01J 9/385* (2006.01)
(Continued)

(52) U.S. Cl.
CPC ............... *H01J 11/20* (2013.01); *H01J 9/385* (2013.01); *H01J 9/39* (2013.01); *H01J 9/40* (2013.01);
(Continued)

(58) Field of Classification Search
CPC .... H01J 11/20; H01J 9/385; H01J 9/39; H01J 9/40; H10W 76/48; H10W 29/00
See application file for complete search history.

(56) References Cited

U.S. PATENT DOCUMENTS 4,014,346 A 3/1977 Brownlee et al.
4,254,775 A 3/1981 Langer
(Continued)

FOREIGN PATENT DOCUMENTS

EP 2934670 B1 1/2018
WO 2012036944 A1 3/2012

OTHER PUBLICATIONS

Henkel, Presentation, Macromelt Molding, 35 pages, https://www.ellsworth.com/globalassets/literature-library/manufacturer/henkel-loctite/henkel-presentation-technolmelt-formerly-branded-as-macromelt-molding.pdf Accessed Mar. 2, 2020.
(Continued)

*Primary Examiner* — Richard A Booth
(74) *Attorney, Agent, or Firm* — Seager, Tufte & Wickhem LLP

(57) ABSTRACT

Implantable medical devices including a housing that contains operational circuitry for the implantable medical device and a dispensed hydrogen getter. The hydrogen getter may include a getter carrier material and one or more getter materials carried as suspensions in the getter carrier material, with the getter materials taking the form of organic compounds, such as fatty acids, or powdered metal oxides, or combinations thereof. The hydrogen getter may instead be comprised of two fatty acids having different melt temperatures. The hydrogen getter may be dispensed onto an encapsulant layer or other component of the implantable medical device, or may be blended into an encapsulant layer.

20 Claims, 6 Drawing Sheets

(51) Int. Cl.
*H01J 9/39* (2006.01)
*H01J 9/40* (2006.01)
*H10W 29/00* (2026.01)

(52) U.S. Cl.
CPC ... *H10W 29/00* (2026.01); *H01J 2217/49264* (2013.01)

(56) References Cited

U.S. PATENT DOCUMENTS

| | | | |
|---|---|---|---|
| 4,314,562 | A | 2/1982 | Ware |
| 5,876,424 | A | 3/1999 | O'Phelan et al. |
| 5,999,398 | A | 12/1999 | Makl et al. |
| 6,031,710 | A | 2/2000 | Wolf et al. |
| 6,428,612 | B1 | 8/2002 | McPhilmy et al. |
| 6,603,654 | B2 | 8/2003 | Rorvick et al. |
| 6,881,516 | B2 | 4/2005 | Aamodt et al. |
| 7,194,309 | B2 | 3/2007 | Ostroff et al. |
| 7,263,401 | B2 | 8/2007 | Scott et al. |
| 7,485,277 | B1 | 2/2009 | Shepodd et al. |
| 7,769,457 | B2 | 8/2010 | Fonte |
| 7,968,226 | B2 | 6/2011 | Aamodt et al. |
| 8,065,006 | B2 | 11/2011 | Rorvick et al. |
| 8,065,007 | B2 | 11/2011 | Ries et al. |
| 8,463,393 | B2 | 6/2013 | Strother et al. |
| 8,774,921 | B2 | 7/2014 | Fonte |
| 9,105,899 | B2 | 8/2015 | Pakula et al. |
| 9,713,725 | B2 | 7/2017 | Bobgan et al. |
| 10,040,021 | B2 | 8/2018 | Ries et al. |
| 10,226,055 | B2 | 3/2019 | Rothfuss et al. |
| 10,434,316 | B2 | 10/2019 | Kelley et al. |
| 10,894,164 | B2 | 1/2021 | Strommer et al. |
| 11,247,059 | B2 | 2/2022 | Keller et al. |
| 2003/0204216 | A1 | 10/2003 | Ries et al. |
| 2005/0245971 | A1 | 11/2005 | Brockway et al. |
| 2009/0034769 | A1 | 2/2009 | Darley et al. |
| 2010/0305654 | A1 | 12/2010 | Fonte |
| 2012/0069536 | A1 | 3/2012 | Sporon-Fiedler et al. |
| 2013/0235550 | A1 | 9/2013 | Stevenson et al. |
| 2015/0196867 | A1 | 7/2015 | Ries et al. |
| 2015/0321013 | A1 | 11/2015 | Smith et al. |
| 2016/0151635 | A1 | 6/2016 | Frysz et al. |
| 2016/0287865 | A1 | 10/2016 | Bobgan et al. |
| 2018/0207427 | A1 | 7/2018 | Webb et al. |
| 2019/0168005 | A1 | 6/2019 | Li et al. |
| 2019/0321628 | A1 | 10/2019 | Stevenson et al. |
| 2020/0054881 | A1 | 2/2020 | Frustaci et al. |
| 2020/0121417 | A1 | 4/2020 | Prescott et al. |
| 2020/0246625 | A1 | 8/2020 | Stevenson et al. |
| 2020/0276440 | A1 | 9/2020 | Stevenson et al. |
| 2021/0121705 | A1 | 4/2021 | Ries et al. |
| 2022/0047876 | A1 | 2/2022 | Becklund et al. |
| 2022/0249852 | A1 | 8/2022 | Peterson |
| 2022/0288401 | A1 | 9/2022 | Landherr et al. |
| 2024/0245923 | A1* | 7/2024 | English ................ A61N 1/3758 |

OTHER PUBLICATIONS

International Search Report and Written Opinion dated Nov. 19, 2021 for International Application No. PCT/US2021/045724.

* cited by examiner

IMPLANTABLE MEDICAL DEVICE SELECTIVE ENCAPSULATION

CROSS REFERENCE TO RELATED APPLICATIONS

The present application claims the benefit of and priority to U.S. Prov. Pat. App. No. 63/461,978, filed Apr. 26, 2023, titled IMPLANTABLE MEDICAL DEVICE SELECTIVE ENCAPSULATION, and U.S. Prov. Pat. App. No. 63/447,750, filed Feb. 23, 2023, titled IMPLANTABLE MEDICAL DEVICE SELECTIVE ENCAPSULATION, the disclosures of which are incorporated herein by reference.

BACKGROUND

A wide variety of active implantable medical devices (IMD) are known, including pacemakers, defibrillators, neural modulation systems, drug pumps, circulatory assist devices, etc. Such devices may include an enclosure, often made of metal and hermetically sealed, which contains operational circuitry for the active IMD. The operational circuitry may be secured or fixed within the housing to prevent relative motion between components, which can cause damage to electrical interconnections and/or componentry. Prior approaches generally have used a frame and/or motion limiting inserts to hold the operational circuitry in desired positions. Electrical insulation between components has usually been provided by air gaps and, as needed, selectively placed shielding. Hydrogen getters have been provided by placing discrete components at selected locations. New and alternative solutions are desired.

OVERVIEW

The present inventors have recognized, among other things, that a problem to be solved is the need for new and/or alternative implantable medical device (IMD) manufacturing methods and designs. In some examples, an implantable medical device is manufactured by placing electrical components inside a mold and/or a portion of the device housing, and selectively depositing or injecting an encapsulant material or dampening layer over and/or around the components where desired. In some examples, a getter is then dispensed at one or more selected locations, either on the encapsulant material or dampening layer, or elsewhere in the IMD. Alternatively, the encapsulant itself may carry a getter material for absorbing hydrogen. In an example a specific blend of getter carrier material and hydrogen getter is formed and used, as stand-alone getter or by mixing into the encapsulant/dampening layer. In some examples, the getter blend forms a suspension of the getter material within the getter carrier during placement, molding or injection. Other examples may include a first material and a catalyst that causes the first material to act as a hydrogen getter, again provided as a blend.

A first illustrative and non-limiting example takes the form of an implantable medical device comprising a housing; operational circuitry disposed within the housing; an encapsulant layer surrounding at least a portion of the operational circuitry, the encapsulant layer; and a dispensed getter comprising each of: a getter carrier material; a first getter material formed of an organic material; and a second getter material formed of a metal oxide; wherein the first and second getter materials are suspended in the getter carrier material. Additionally or alternatively, the getter carrier material has a lower melt temperature than the first getter material and the second getter material. Additionally or alternatively, the getter carrier material is a thermoplastic styrenic elastomer. Additionally or alternatively, the getter carrier material is a hydrogenated thermoplastic styrenic elastomer. Still further, additionally or alternatively, the getter carrier material is hydrogenated styrene-ethylene-butadiene-styrene (SEBS).

Additionally or alternatively, the implantable medical device may further comprise desiccant material inside the housing, the desiccant material adapted to absorb water molecules formed in the dispensed getter when the metal oxide loses oxygen to the organic material. Additionally or alternatively, the first getter material is formed of a fatty acid. Additionally or alternatively, the getter carrier material makes up 50% to 95% of the dispensed getter by weight, and the first and second getter carrier materials make up 50% to 5% of the dispensed getter layer by weight. Additionally or alternatively, the getter carrier material makes up 50% to 95% of the dispensed getter by volume, and the first and second getter carrier materials make up 50% to 5% of the encapsulant layer by volume.

Another illustrative and non-limiting example takes the form of an implantable medical device comprising: a housing; operational circuitry disposed within the housing; and a dispensed getter directly dispensed into the housing, the dispensed getter comprising each of: a catalyst material; a first getter material formed of a first organic material; and a second getter material formed of a second organic material; wherein the first getter material has a melt temperature that is at least 20 c lower than the melt temperature of the second getter material.

Additionally or alternatively, the dispensed getter is comprised, by weight, of about 10% to about 75% of the first getter material, about 25% to about 90% of the second getter material, and about 0.5% to about 30% of the catalyst material. Additionally or alternatively, the first getter material is formed of a fatty acid. Additionally or alternatively, the second getter material is formed of a fatty acid. Additionally or alternatively, the dispensed getter is comprised, by volume, of about 10% to about 75% of the first getter material, about 25% to about 90% of the second getter material, and about 0.5% to about 30% of the catalyst material.

Additionally or alternatively, the catalyst material is a metal oxide. Additionally or alternatively, the implantable medical device further includes an encapsulant layer disposed inside the housing and surrounding at least a portion of the operational circuitry, wherein the dispensed getter is disposed in a cavity formed in the encapsulant layer.

Another illustrative and non-limiting example takes the form of a method of manufacturing an implantable medical device comprising: assembling a plurality of electrical components on a printed circuit board assembly; dispensing an encapsulant layer over one or more of the plurality of electrical components, such that a cavity is formed in the encapsulant layer; dispensing a hydrogen getter in the cavity, wherein the hydrogen getter is dispensed with at least a first portion thereof in a melted state.

Additionally or alternatively, the hydrogen getter comprises: a getter carrier material having a first melt temperature; and a getter material having a second melt temperature higher than the first melt temperature; wherein the step of dispensing the hydrogen getter is performed with the hydrogen getter at a temperature above the first melt temperature and below the second melt temperature. Additionally or alternatively, the first melt temperature is at least 10 c lower than the second melt temperature.

Another illustrative and non-limiting example takes the form of an implantable medical device comprising: a housing; operational circuitry disposed within the housing; and an encapsulant layer surrounding at least a portion of the operational circuitry; and a dispensed hydrogen getter dispensed onto the encapsulant layer, the dispensed hydrogen getter comprising each of: a getter carrier material having a first melt temperature; and a getter material having a second melt temperature; wherein the first melt temperature is at least 10 c lower than the second melt temperature.

Additionally or alternatively, the first melt temperature is at least 20 c lower than the second melt temperature. Additionally or alternatively, the getter material includes each of a powdered metal getter material, and an organic getter material, wherein the organic getter material has the second melt temperature. Additionally or alternatively, the powdered metal getter material is one of platinum oxide or palladium oxide. Additionally or alternatively, the organic getter material is a double or triple bond fatty acid. Additionally or alternatively, the getter material comprises a first organic getter material having the first melt temperature, and a second organic getter material having a third melt temperature which is higher than the first melt temperature.

This overview is intended to introduce the subject matter of the present patent application. It is not intended to provide an exclusive or exhaustive explanation. The detailed description below provides further details about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
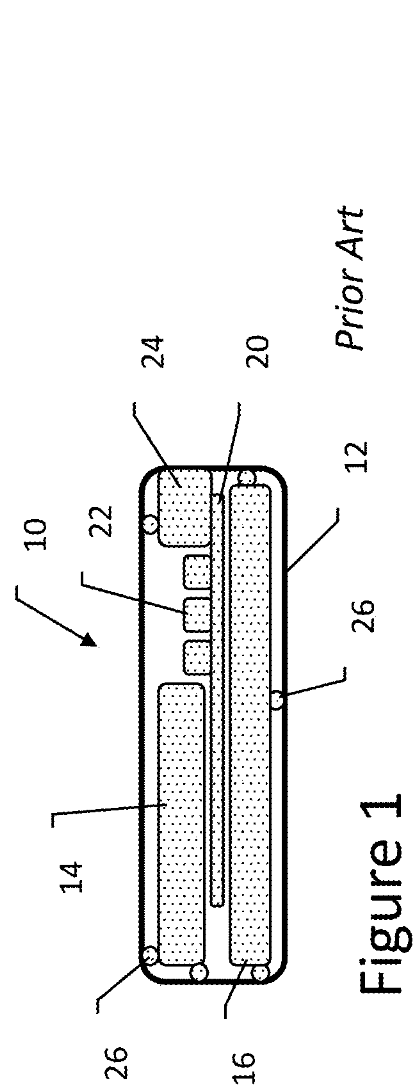
FIGS. 1 and 2 show an illustrative prior art IMD in simplified section view.
Figure 2:
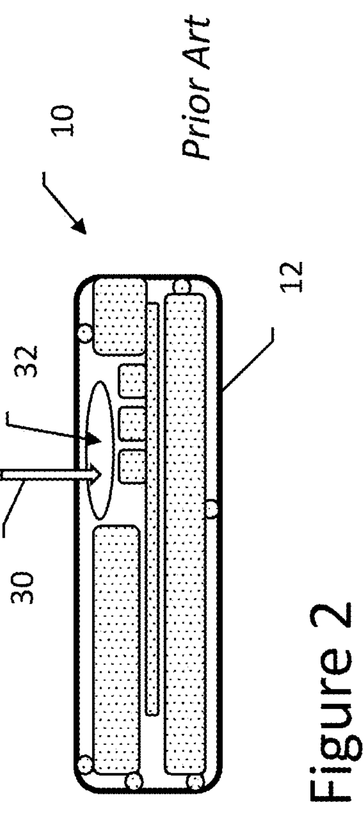

FIGS. 1 and 2 show an example prior art implantable medical device in a simplified section view. Starting with FIG. 1, an implantable medical device 10 is shown in a simplified section view. The device includes a housing 12 which is typically hermetically sealed, and may be made of any suitable material including metal, plastic, or other materials. Titanium is a commonly used material for housing 12, though other materials may be used as desired.

Inside the housing 12 are various components, shown illustratively as a battery 14, a capacitor 16, and a printed circuit board assembly (PCBA) 20 which carries a plurality of electric components 22 and is coupled to a feedthrough assembly 24. The feedthrough assembly 24 is used for coupling the PCBA and components 22 to the outside of the device through a feedthrough to an external device, such as a lead, as is well known in the art. While not shown, housing 12 may include a header coupled to the feedthrough assembly 24 having a port or ports for receiving one or more leads.

The drawings herein generally correspond to an implantable defibrillator, which will have one or more relatively large capacitors 16; other implantable medical devices may have componentry of different types and relative sizes. The present invention may be used for any implantable medical device (IMD). IMDs may be, for example and without limitation, pacemakers, defibrillators, cardiac monitors, cardiac resynchronization therapy devices, cardiac assist devices, neurostimulators, neuromodulators, spinal cord stimulators, sacral, occipital, and/or Vagus nerve stimulators, deep brain stimulation systems, or other systems. Some devices may store a therapeutic substance, such as a drug, if the IMD is a drug pump, or insulin, if the IMD is an insulin source. A reservoir for a therapeutic substance may be refillable, if desired. Devices may have a rechargeable battery and associated battery charging circuitry, or may use a non-rechargeable battery.

The components in the device 10 are held in position by a plurality of stabilizing features 26. The stabilizing features in the prior art may be, for example and without limitation, polymeric dots, bars, rods, or an overall frame that holds the components in a desired position relative to the housing 12 and other components. The rest of the interior of the housing 12 is filled with gas/air. The gas/air provides thermal insulation between the components and the housing, as well as among the components. For example, if a processor is provided as one of the components 22, when that processor is active, convection via gas contained in the housing will not provide much thermal transmission of heat to other components; however, heat may conduct via the PCBA 20 to some extent. The stabilizing features separate components from the housing which, in some examples, may be electrically conductive, such that the stabilizing features and/or air serve as a dielectric. Additional shielding may be provided, as desired. The stabilizing features also provide a degree of mechanical damping to internal components, as vibration of the electrical components and connections can lead to various types of failure.

FIG. 2 is similar to FIG. 1, but shows a prior art process step that is performed as part of manufacturing quality management. A residual gas analysis (RGA) step is shown. An RGA probe 30 is inserted into the housing 12, typically by piercing a side of the housing 12, and obtains a sample of the residual gas inside the housing 12 after manufacturing processes are completed. This destructive testing may be performed on a sampled basis, such as a predetermined number of devices per lot, or other manufacturing quantity, to ensure that manufacturing processes are well controlled. The RGA probe 30 will be inserted at a selected location to ensure that the RGA probe 30 obtains a gas sample from a free space 32 inside the housing. That is, in order to perform the RGA test, the RGA probe 30 should not strike the battery or other operational circuitry.

US PG Pat. Pub. 2022/0047876, titled IMPLANTABLE MEDICAL DEVICE WITH RELATIVE MOTION CONTROL, which is incorporated herein by reference, describes an alternative to the use of a frame as shown in FIGS. 1-2 herein. Motion inside the housing can be controlled by using a dampening layer (referred to interchangeably here as an encapsulant layer) which is molded onto one or more components. However, doing so also presents new challenges and opportunities.

Figure 3:
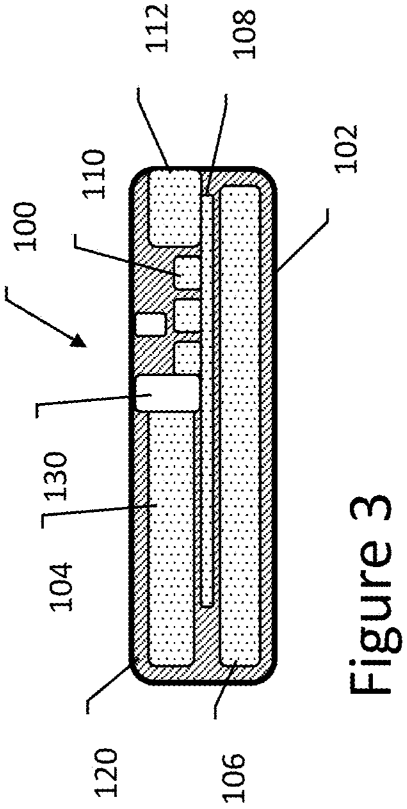
FIG. 3 shows an illustrative example in simplified section view.

FIG. 3 shows an illustrative example of an implantable medical device with a motion dampening layer, in simplified section view. The device 100 includes a housing 102 containing operational circuitry including a battery 104, capacitor 106, and PCBA 108 that carries electronic component 110 and couples to a feedthrough assembly 112. Rather than using the stabilizing features 26 of FIG. 1, the device has a molded dampening layer 120. The dampening layer 120 may be placed over at least some components, or portions of some components, of the operational circuitry.

Voids may be included, such as shown at 130, to provide thermal or vibrational isolation of particular components. For example, a void may be provided to allow RGA to be performed at a desired location. A void may also be provided to limit thermal conduction through the encapsulant layer to sensitive locations in the device, such as a header region of a battery cell, as discussed in U.S. Prov. Pat. App. No. 63/443,570, filed Feb. 6, 2023 and titled IMPLANTABLE MEDICAL DEVICE WITH MOTION DAMPING LAYER, the disclosure of which is incorporated herein by reference. In some examples, one or more of the voids may be used as a receiving location for receiving a dispensed hydrogen getter material.

Figure 4:
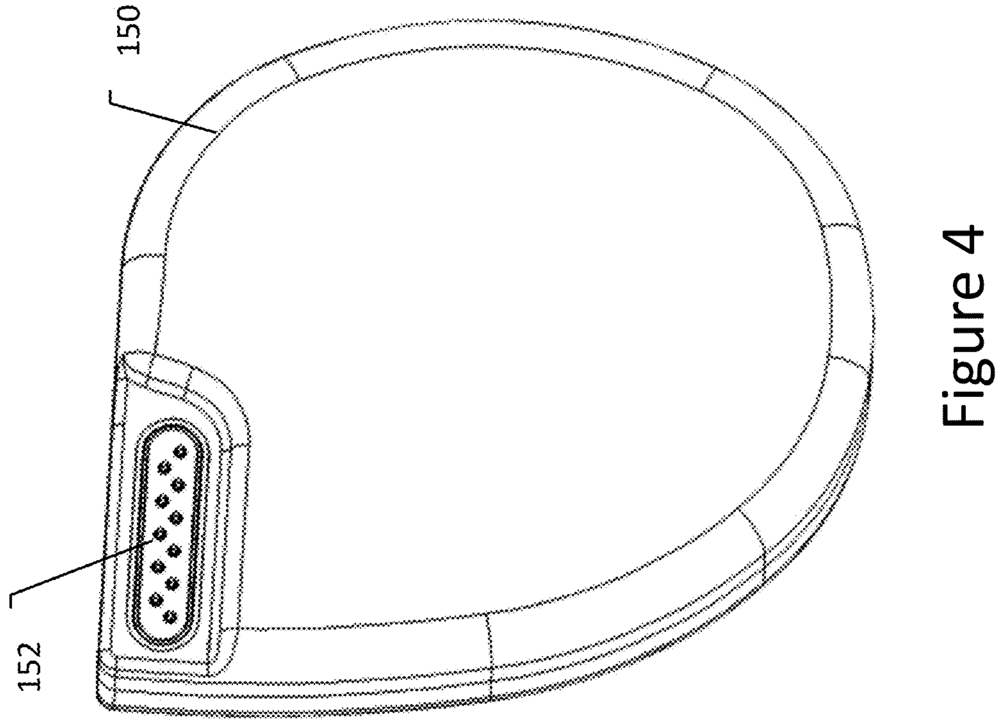
FIG. 4 is a perspective view of an IMD.

A detailed example using an illustrative prototype follows. FIG. 4 is a perspective view of an IMD. As shown, the IMD may include a canister 150, often formed of a conductive metal such as titanium, for example. A header region is provided with feedthroughs, as shown at 152, for coupling to a lead, for example, though the header itself is omitted in FIG. 4.

Figure 5:
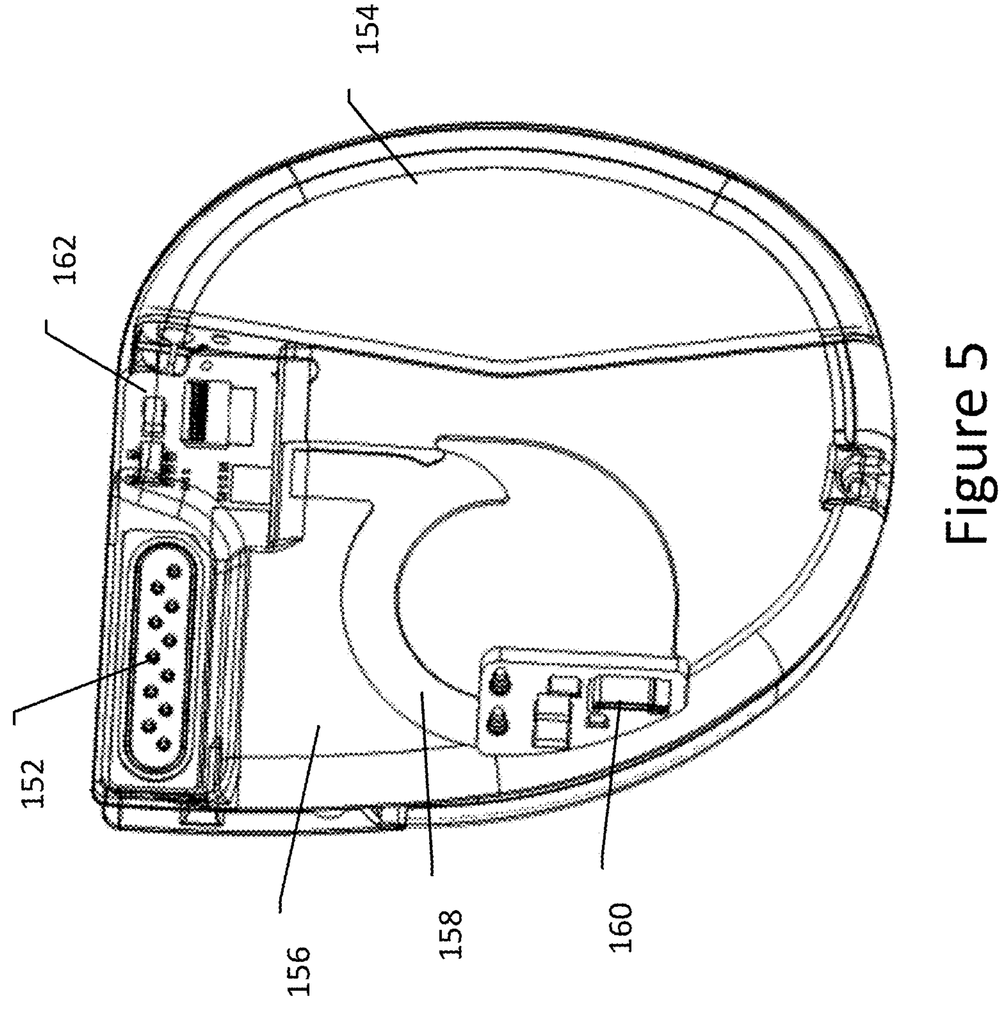
FIG. 5 is a perspective view of the IMD of FIG. 4, with several components removed to illustrate internal details.

FIG. 5 is a perspective view of the IMD of FIG. 4, with several components removed to illustrate internal details. A portion of the device housing is omitted. The header region can still be observed at 152. A relatively large capacitor is shown at 154 (the example taking the form of a defibrillator) . A portion of encapsulant can be seen at 156, including a channel for receiving a speaker or piezo-electric component, such as a speaker, with a void formed surrounding a driver circuit shown at 160 for the speaker. The drawing shows how voids and gaps may be used when molding an encapsulant layer 156 for selected components to be isolated from the encapsulant. It should be noted that some of the features shown in FIG. 5 may be formed during placement of the encapsulant on or over one or more of the components that have been removed for purposes of showing the drawing. A multi-step molding process may be used, if desired, for example by providing a second shot of encapsulant in region 162 separate from the layer shown at 156. This may simplify molding and/or allow the use of multiple encapsulant portions having different characteristics from one another, if desired.

Figure 6:
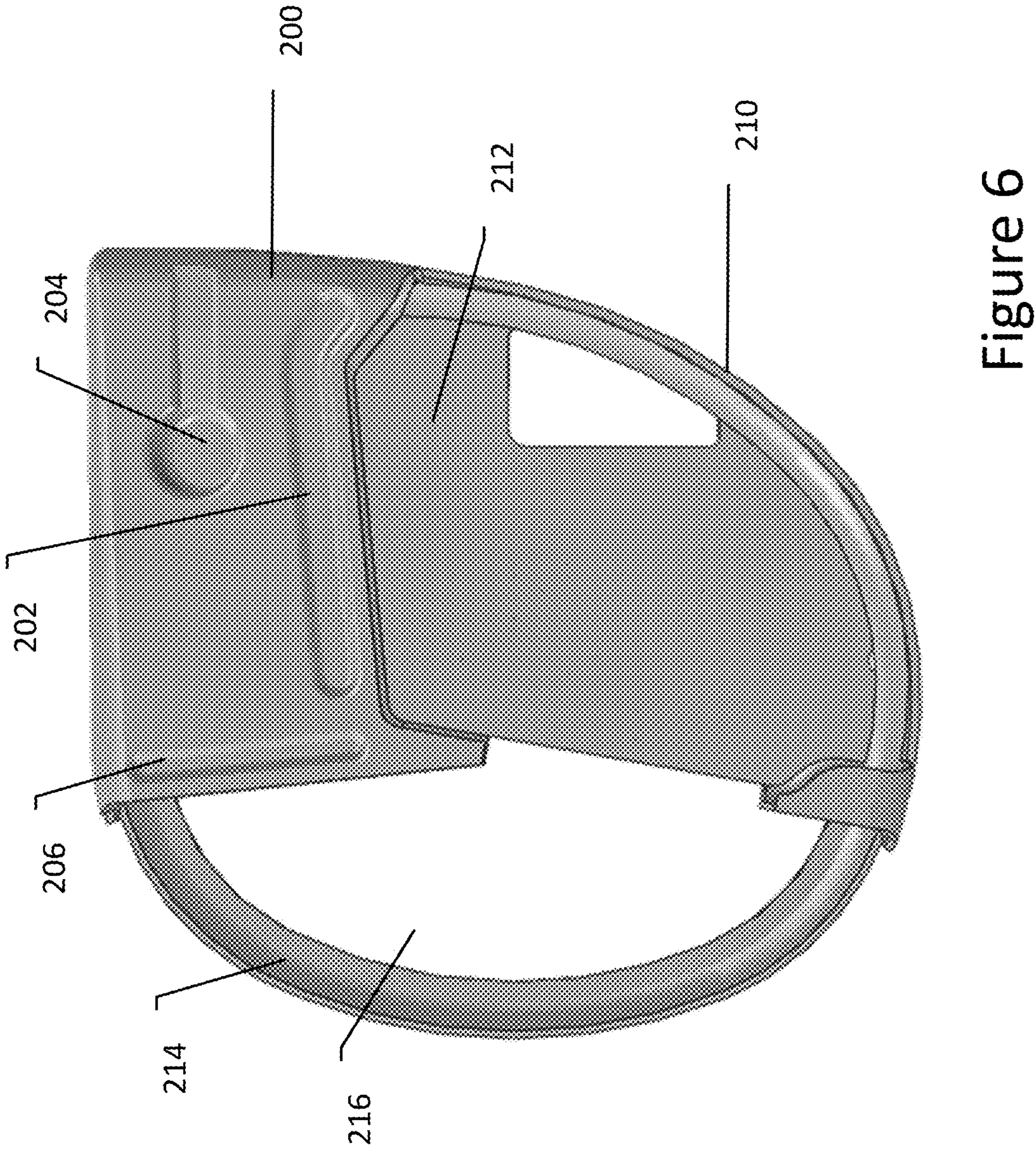
FIGS. 6-7 show front and rear views of an encapsulant/dampening layer.
Figure 7:
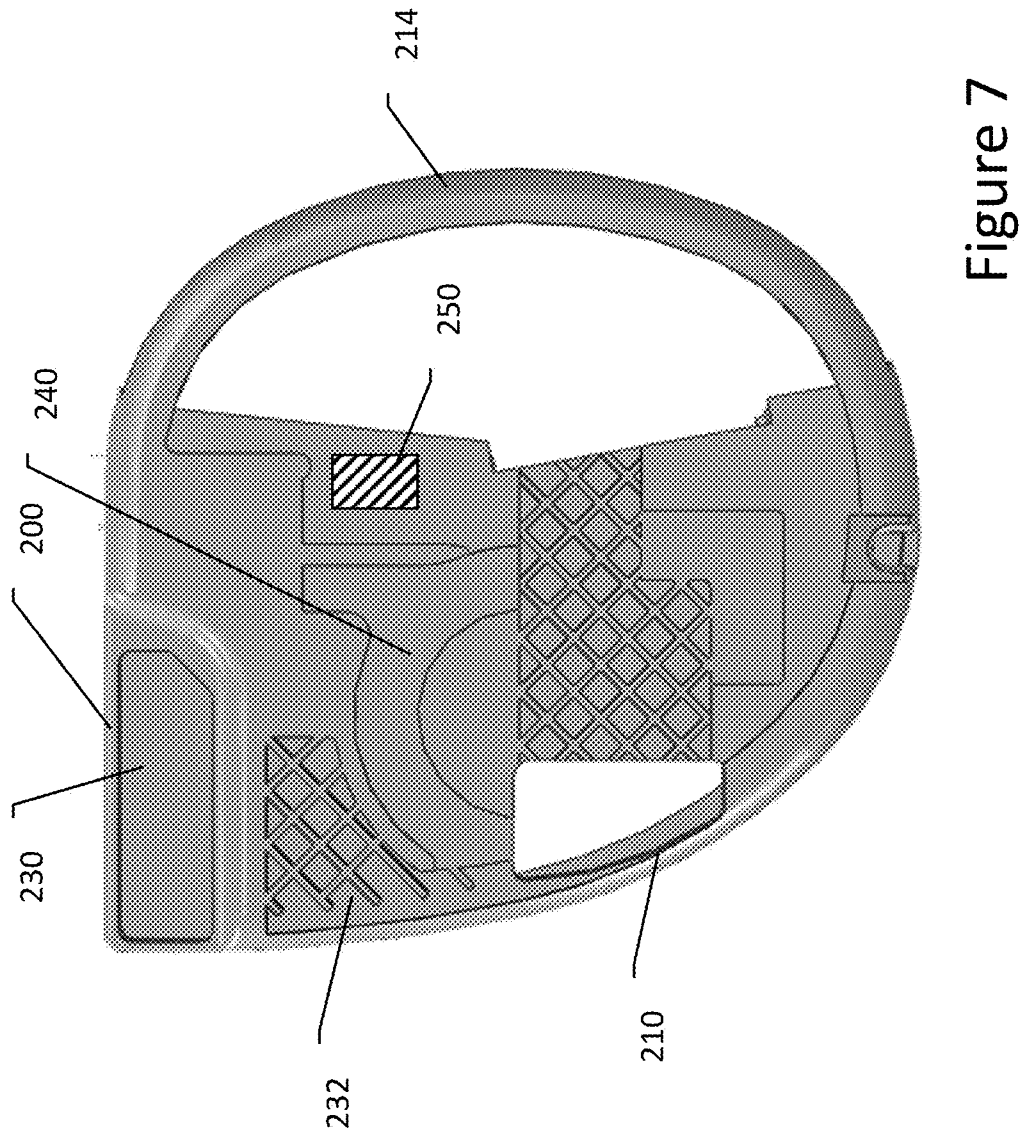

FIGS. 6-7 show front and rear views of an encapsulant/dampening layer. Starting with FIG. 6, the encapsulant or dampening layer 200 is shown with a range of features and particular designs. A channel is provided at 202, for example, to reduce thermal conductivity of the encapsulant or dampening layer 200 in the region of a battery header, where battery may reside in region 212 in this example. Capacitors may sit in region 216, with a surrounding ring having portions 210 and 214 for providing vibrational insulation as well as separation from the device housing. An RGA test void is formed at 204. Thermal isolation of connections to the capacitors may also be provided by a thinned region at 206; in the alternative, region 206 may serve to receive a dispensed getter or desiccant, as further discussed below. That is, the region 206 may receive a dispensed getter or desiccant, or a discrete (separately formed and then placed) getter or desiccant, if desired.

The dampening layer 200 may be provided as a discrete component, however, in favored examples, the dampening layer is formed of a material that is dispensed directly onto one or more components of an IMD, more preferably onto multiple components of the IMD in a single application, injections, or "shot" of the dampening layer. The dampening layer 200 may have a shape defined in some regions, such as area 212, by a component of the IMD, and in other regions, such as the RGA test void 204 and/or channel 202, the shape of the dampening layer 200 may be provided by a mold and/or mandrel. Still other parts of the dampening layer shape may be determined by the shape of the device housing, such as the outside surface of the surrounding ring portions 210, 214.

Turning to FIG. 7, the encapsulant may include a thinned region at 230 adjacent to a feedthrough region to limit thermal conductivity in this area, and waffling at 232 which reduces mass and may provide thermal insulation and motion reducing properties relative to the outer canister. A mold, for example, may be used to provide the waffling 232 prior to placement in a device canister/housing, or prior to placement of one or more parts of the device canister/housing. The outer ring is again illustrated at 210 and 214. A channel for receiving a piezo-electric component is highlighted as well at 240.

Hydrogen getters are used to remove residual hydrogen gas and/or hydrogen gas that is formed by or outgassed from components inside an IMD over time. Getters are often provided as a discrete component, such as a sheet of getter material that is placed, sometimes using an adhesive, at a desired position in the device. Discrete getters have to be provided inside the device in a controlled environment to prevent the active material of the getter from reacting with the ambient environment and being rendered useless. The discrete getter, the process steps needed to place it, and the environmental demands of such devices, all add cost and design complexity both to the final product as well as the manufacturing process.

In an illustrative example, a hydrogen getter may be dispensed directly into the pulse generator. For example, a hydrogen getter 250 can be dispensed as shown at a predetermined position on the encapsulant layer. While some examples discussed below disperse the hydrogen getter material in an encapsulant layer, other examples have a separately dispensed hydrogen getter. The hydrogen getter 250 may, instead, be formed separately and placed into a desired position. However, dispensing the hydrogen getter 250 may allow the material of the getter to become attached to the encapsulant layer during the dispensing step, rather than using an adhesive to secure a discrete hydrogen getter component into place, reducing complexity of the product and avoiding the need to carefully handle a discrete component within a controlled environment.

The material composition of a hydrogen getter may vary depending on whether the hydrogen getter is part of the larger encapsulant layer, in which case concentration of the hydrogen getter may be relatively lower, than if the hydrogen getter a separately dispensed component or is positioned as a discrete component.

In some examples, a relatively higher concentration of getter material is suspended in a carrier material or catalyst material for dispensing as a separate component, as shown by FIG. 7, for example. In other illustrative examples, an encapsulant layer itself may serve as a bulk or carrier material in which a getter material is mixed, blended, or suspended. The getter material may be provided in a suspension, and if so, it may not be necessary to protect the getter material from short term exposure to the environment. That is, the absorption of hydrogen gas for getter material provided in a suspension with a second material will be much slower than it is with known discrete component getters, so that the getter material in suspension will not be quickly exhausted due to exposure to air. This simplifies manufacturing processes and reduces overall costs. Some examples can use a blend of a getter material and a catalyst, with the blend and catalyst in solid form so that hydrogen reaction is slow enough to allow environmental exposure during manufacturing without loss of utility for the hydrogen getter. Each of a carrier, getter material, and catalyst may be used in some examples.

An illustrative example uses a fatty acid as an organic getter material. Unsaturated fatty acids may be used, for example, as these have double carbon bonds. The fatty acid can become hydrogenated as it absorbs hydrogen gas. Various double or triple carbon bond organic materials, including unsaturated fatty acids, may be used. Some illustrative organic fatty acids such as dimerized phenyl propargyl ether (DPPE), bis(phenylethynyl)benzene (DEB).

Other illustrative examples may instead use a precious metal oxide as the getter material. For example, platinum oxide or palladium oxide may be used. Other metals in the platinum group may be used (Rh and Ru, for example), as desired. Such metal materials are often made available as powder materials that need to be blended with a binder for placement purposes. The use of powdered metals in the manufacturing environment of an implantable medical device is troublesome, however, as such powders can become foreign material particles, causing various problems in the manufacturing environment/clean room in which IMD products are assembled. By blending the metal powder into a suspension with a carrier material, rather than merely using a binder material, the metal powder material is more readily used.

The organic getter material can be dispensed within a hydrogenated styrene-ethylene-butadiene-styrene (SEBS) getter carrier material. Other getter carrier materials may be used as desired.

Some examples may use both an organic compound getter and a precious metal getter material in one combination, creating a multi-stage getter material. For example, a metal oxide such as platinum oxide or palladium oxide is mixed along with the organic compound getter (fatty acid) in the carrier material, such as SEBS getter carrier material. In such a combination, the metal oxide also may serve as catalyst for the organic compound getter. In other examples, the getter carrier material may be omitted, and an organic compound getter, or a mix of two organic compound getters, may have a metal oxide catalyst carried therein. For some examples, the result may be understood as a multi-stage getter. In an example, a metal oxide reacts with the organic compound getter(s) to form water molecules when losing the oxide; as this happens, the metal oxide completes its role as a catalyst and instead becomes another getter material. A separate desiccant material may also be provided, such as with a discrete desiccant, or by blending of a desiccant into the encapsulant material, to absorb any water that is formed in this process.

Traditional getter control may include the use of sulfur to inhibit or slow the reaction of a getter. However, sulfur can be present in the IMD due to the other components in the package, such as various electronic, carrier, coupler, insulator and/or adhesives. With the use of the encapsulant with two getter materials present, the sulfur does not inhibit getter performance.

For a separately dispensed getter that is not part of an encapsulant layer, the dispense material may comprise a getter carrier and getter material, with the getter carrier forming 50% to 95% of the dispense material by weight or volume, and the getter material(s) forming the remaining 5% to 50% of the dispense material by weight or volume. The getter carrier, further, may have a melt temperature that is at least 10 c lower than the melt temperature of any of the getter materials. (As used herein, a number followed immediately by a "c" is intended to mean a temperature or temperature differential measured in degrees Celsius, so 10 c means 10 degrees Celsius). It may be further preferred to have a getter carrier with a melt temperature that is in the range of 20 c or more below the melt temperature of the getter material. A getter carrier having a melt temperature in the range of about 50 c-70 c may be desired, for example if used with DBBS, having a melt temperature of about 80 c, where DBBS is the getter material. During dispensing of this suspension/blend, the temperature can be controlled to ensure that the getter carrier is in a melted state, while the getter materials are not melted. Other factors to consider in the selection of materials include the temperature sensitivity of electrical components in the IMD, as well as the temperature variables of processing, storage, and transport (high and low temperature bounds) and eventual implant in a human patient having a normal body temperature of about 37 c.

Another benefit of using both an organic getter and a metal oxide suspended therein (or in a carrier material) is the potential to reduce costs, as metal oxide getter materials typically use expensive precious metals. The organic getter and/or carrier materials, on the other hand, are typically quite cheaply available.

The mixture may be formed in any desired order. In an example, desired amounts of the metal oxide, fatty acid, and getter carrier materials are blended in a single step. In another example the metal oxide and getter carrier are first blended, and then the fatty acid is added, where "blended" may mean melting the getter carrier without melting the other materials. In another example, the fatty acid and getter carrier are first blended, and then the metal oxide is added, where "blended" may mean melting the getter carrier without melting the other materials.

In one example, a dispense material includes about 50% SEBS to about 95% SEBS as the getter carrier (by volume or weight), and about 50% to about 5% getter material, present as a mix of double or triple carbon bond organic with a catalyst, or a metal oxide getter. Here, the getter material may have about 0.5% up to 45% Metal oxide (Platinum oxide or Palladium oxide, or other metal oxide) with a double or triple carbon bond organic material forming about 55% to about 99.5% of the getter material by volume or weight.

In another example, a double organic material H2 getter may be used. For example, a first organic getter material having a first melt temperature may be used along with a second organic getter material having a second melt temperature that is about 20 c higher than the first melt temperature. The getter material can then be, for example and without limitation, a blend of the first organic getter material in a range of about 25% to about 90%, with about 10% to about 75% of the second organic material, the remainder being about 0.5% to 30% catalyst material, where the catalyst material may be a metal oxide. The getter material may make up the entirety of a dispensed getter, such as shown at 250 in FIG. 7. Alternatively, the getter material may further be blended with a carrier material, where the getter material forms about 50% to about 95% of the dispensed getter, where each percentage can be either mass or volume. The carrier material may, as in previous examples, have a lower melt temperature than the other components of this mix, so that placement may be achieved without altering the chemical properties of the organic material and/or metal oxide. For example, the carrier material may have a melt temperature in the range of about 70 c, with the organic getter materials having melt temperatures at least 10 c higher than that of the carrier material.

SEBS is an example of a thermoplastic elastomer that may be used as the getter carrier. SEBS may be characterized as a thermoplastic styrenic elastomer. The getter carrier may be, for example and without limitation, any of a thermoplastic, an elastomer, a thermoplastic elastomer (TPE), or a hot melt polymer. Other examples include high performance polyamide (PA) hotmelt adhesives, such as Henkel® Macromelt® 653 and Henkel® Macromelt® 673. These are moldable under low pressure (between 2 and 40 bar), are solvent free, have short cycle time (10-50 seconds), do not require a heat curing process, and adhere to polar plastics such as polyamide, acrylonitrile butadiene styrene (ABS), and polyvinyl chloride (PVC). In some examples, polyamide hotmelt molding can achieve enhanced sealing and improved protection of electrical components as compared to conventional 2-part casting materials (epoxy) or potting resins or silicones. The polyamide hotmelt molding material is a single component material that provides watertight encapsulation and electrical insulation. Other hotmelts may be used, such as the copolymers Henkel® Technomelt® AS4226, or Henkel® Technomelt® AS8998 (a polyolefin). Further examples include maskants such as Dymax® Speedmask® 726-SC and Dymax® Speedmask® 728-G. These moldable acrylated urethanes have a fast cure time (8-10 seconds) under UV or visible light, and have a Shore D hardness of 40-55. Another example of a suitable moldable material is Robnor ResinLab® EL227CL, a two-part low viscosity polyurethane resin with a Shore A hardness of 16. Other acrylated urethanes may be used, such as Dymax® Speedmask® 9-7001 or Dymax® Speedmask® 9-20479-B-REV-A. A further example of a moldable material is polycaprolactone.

In some examples, a powdered metal getter material can be mixed or blended into, for example, a hot melt polymer and/or a copolymer such as a Technomelt® such as one of those identified above, and then dispensed either as an encapsulant layer in its own right, or as a separate hydrogen getter. Other examples may mix the powdered metal getter, such as titanium, platinum or palladium, with any of polyether ether ketone (PEEK), silicone, or another low melt temperature polymer for use in a dispensed getter.

As noted, a multi-part encapsulant may be used. In an example, the multi-part encapsulant includes one or more parts that serve as a getter by combining both an encapsulant and any of the above noted blends of materials that can serve as a dispensed getter. For example, a hot melt polymer or a copolymer such as Technomelt® may be used as an encapsulant in a multi-shot placement of the encapsulant, where each "shot" of the encapsulant covers or otherwise secures one or more components of the implantable device. For the encapsulant portion that comprises the getter, the bulk material may be an encapsulant (hot melt polymer or copolymer) with 0.1% to 10% by weight or volume of a getter material, such as any of the above noted compounds including precious metal oxides and/or organic getter materials, such as fatty acid materials noted above.

In still other examples, each portion of the encapsulant may include getter materials such as the metal oxides and/or organic getter materials described above, in a ratio of about 0.01% to about 10% by weight or volume of the getter material, or blend of getter material with getter carrier, in a bulk encapsulant material.

The exact amount of getter material needed may be determined analytically and via testing. For example, testing of components in an aging/drying process (accelerated or not) can be used to estimate how much hydrogen will be outgassed and/or released, or seep into, an IMD canister during the life of the device. The quantity of getter material needed can then be determined by taking a worst case estimate of how much hydrogen can accumulate within the IMD canister, adding a margin to the worst-case estimate, and ensuring that adequate hydrogen getter capacity is provided.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." Moreover, in the claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic or optical disks, magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, innovative subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the protection should be determined with reference to the appended claims, along with the full scope of equivalents to which such claims are entitled.

What is claimed is:

1. An implantable medical device comprising:
a housing;
operational circuitry disposed within the housing;
an encapsulant layer surrounding at least a portion of the operational circuitry, the encapsulant layer; and
a dispensed getter comprising each of:
a getter carrier material;
a first getter material formed of an organic material; and
a second getter material formed of a metal oxide;
wherein the first and second getter materials are suspended in the getter carrier material.

2. The implantable medical device of claim 1, wherein the getter carrier material has a lower melt temperature than the first getter material and the second getter material.

3. The implantable medical device of claim 1, wherein the getter carrier material is hydrogenated styrene-ethylene-butadiene-styrene.

4. The implantable medical device of claim 1, further comprising a desiccant material inside the housing, the desiccant material adapted to absorb water molecules formed in the dispensed getter when the metal oxide loses oxygen to the organic material.

5. The implantable medical device of claim 1, wherein the first getter material is formed of a fatty acid.

6. The implantable medical device of claim 1, wherein the getter carrier material makes up 50% to 95% of the dispensed getter by weight, and the first and second getter carrier materials make up 50% to 5% of the dispensed getter layer by weight.

7. The implantable medical device of claim 1, wherein the getter carrier material makes up 50% to 95% of the dispensed getter by volume, and the first and second getter carrier materials make up 50% to 5% of the encapsulant layer by volume.

8. An implantable medical device comprising:
a housing;
operational circuitry disposed within the housing; and
a dispensed getter directly dispensed into the housing, the dispensed getter comprising each of:
a catalyst material;
a first getter material formed of a first organic material; and
a second getter material formed of a second organic material;
wherein the first getter material has a melt temperature that is at least 20° C. lower than the melt temperature of the second getter material.

9. The implantable medical device of claim 8, wherein the dispensed getter is comprised, by weight, of about 10% to about 75% of the first getter material, about 25% to about 90% of the second getter material, and about 0.5% to about 30% of the catalyst material.

10. The implantable medical device of claim 8, wherein at least one of the first getter material and the second getter material is formed of a fatty acid.

11. The implantable medical device of claim 8, wherein the dispensed getter is comprised, by volume, of about 10% to about 75% of the first getter material, about 25% to about 90% of the second getter material, and about 0.5% to about 30% of the catalyst material.

12. The implantable medical device of claim 8, wherein the catalyst material is a metal oxide.

13. The implantable medical device of claim 8 further comprising an encapsulant layer disposed inside the housing and surrounding at least a portion of the operational circuitry, wherein the dispensed getter is disposed in a cavity formed in the encapsulant layer.

14. An implantable medical device comprising:
a housing;
operational circuitry disposed within the housing; and
an encapsulant layer surrounding at least a portion of the operational circuitry; and
a dispensed hydrogen getter dispensed onto the encapsulant layer, the dispensed hydrogen getter comprising each of:
a getter carrier material having a first melt temperature; and
a getter material having a second melt temperature;
wherein the first melt temperature is at least 10° C. lower than the second melt temperature.

15. The implantable medical device of claim 14, wherein the first melt temperature is at least 20 c lower than the first melt temperature.

16. The implantable medical device of claim 14, wherein the getter material includes each of a powdered metal getter material, and an organic getter material, wherein the organic getter material has the second melt temperature.

17. The implantable medical device of claim 16, wherein the powdered metal getter material is one of platinum oxide or palladium oxide.

18. The implantable medical device of claim 16, wherein the organic getter material is a double or triple bond fatty acid.

19. The implantable medical device of claim 14, wherein the getter material comprises a first organic getter material having the first melt temperature, and a second organic getter material having a third melt temperature which is higher than the first melt temperature.

20. The implantable medical device of claim 14, wherein the getter carrier material is hydrogenated styrene-ethylene-butadiene-styrene.

* * * * *